United States Patent
Sasajima

(10) Patent No.: US 7,180,310 B2
(45) Date of Patent: Feb. 20, 2007

(54) AMPLITUDE VARYING DRIVER CIRCUIT AND TEST APPARATUS

(75) Inventor: Kei Sasajima, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/976,354

(22) Filed: Oct. 27, 2004

(65) Prior Publication Data

US 2006/0087328 A1  Apr. 27, 2006

(51) Int. Cl.
  *G01R 27/08* (2006.01)
  *H03F 3/45* (2006.01)
(52) U.S. Cl. .......................... 324/716; 326/89; 327/52; 327/306
(58) Field of Classification Search ............... 324/713
  See application file for complete search history.

(56) References Cited

U.S. PATENT DOCUMENTS

| | | | | |
|---|---|---|---|---|
| 4,517,476 A | * | 5/1985 | Barre | 326/126 |
| 4,621,206 A | * | 11/1986 | Hashimoto | 327/65 |
| 5,001,362 A | * | 3/1991 | Tran | 327/103 |
| 5,184,029 A | * | 2/1993 | King | 326/126 |
| 6,111,716 A | * | 8/2000 | Ngo et al. | 360/67 |
| 6,294,949 B1 | | 9/2001 | Kojima et al. | |
| 2002/0118065 A1 | | 8/2002 | Miyamoto | |
| 2003/0228852 A1 | | 12/2003 | Murakami et al. | |
| 2005/0088233 A1 | * | 4/2005 | Miyashita et al. | 330/252 |

FOREIGN PATENT DOCUMENTS

| | | |
|---|---|---|
| EP | 1560331 A1 | 8/2005 |
| JP | 2001-057512 A | 2/2001 |
| JP | 2002-330039 A | 11/2002 |
| JP | 2004-015409 A | 1/2004 |
| JP | 2004-266309 A | 9/2004 |

OTHER PUBLICATIONS

International Search Report dated Feb. 7, 2006 issued in International Application No. PCT/2005/018711, 7 pages, with English translation (2 pages).

* cited by examiner

*Primary Examiner*—Andrew H. Hirshfeld
*Assistant Examiner*—Timothy J. Dole
(74) *Attorney, Agent, or Firm*—Osha Liang LLP

(57) ABSTRACT

There is provided an amplitude varying driver circuit operable to output an output signal, which is an amplified input signal being supplied. The amplitude varying driver circuit includes: a plurality of differential amplifiers provided in parallel with one another, wherein a signal corresponding to the input signal is input into each base terminal thereof; a resistor section, which is provided in series with the plurality of differential amplifiers, operable to establish potential of the output signal according to total current flowing to the plurality of differential amplifiers; and an amplitude control transistor, which is provided in series with the plurality of differential amplifiers, operable to define total current flowing to the plurality of differential amplifiers.

9 Claims, 5 Drawing Sheets

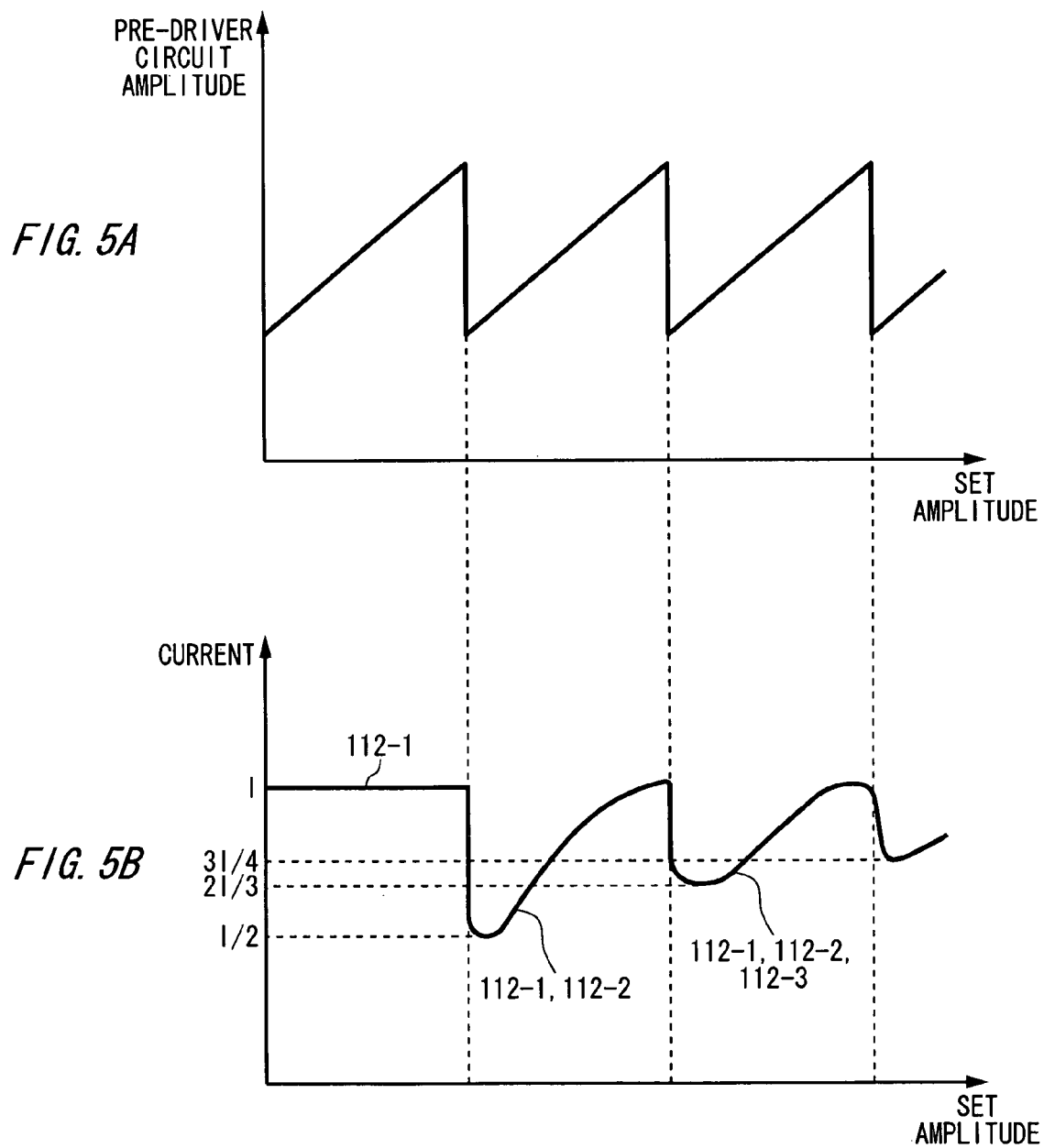

AMPLITUDE VARYING DRIVER CIRCUIT AND TEST APPARATUS

BACKGROUND OF THE INVENTION

1. Field of the Invention

The present invention relates to a test apparatus including an amplitude varying driver circuit which outputs an output signal according to an input signal, and an amplitude varying driver circuit. More particularly, the present invention relates to an amplitude varying driver circuit which outputs an output signal, which is an amplitude-changed input signal.

2. Description of Related Art

Conventionally, a circuit using a differential amplifier as a circuit for changing amplitude of an input signal and outputting the signal is known. Such a circuit controls a current flowing to the differential amplifier, and generates and outputs a potential of the output signal according to the current using a resistor connected to the differential amplifier in series.

In such a circuit, when increasing amplitude varying range, change of the current flowing to the differential amplifier increases, and it is difficult to maintain quality of an output wave between a high amplitude output and a low amplitude output.

Since a transition frequency of a transistor is dependent on a current flowing to the transistor, transition frequencies differ between a high amplitude output and a low amplitude output. Generally, a transistor, which is suitable for the transition frequency optimal for the high amplitude output, is selected. However, in such a case, the transition frequency for the low amplitude output will decrease, and sufficient switching characteristic will not be attained, and a waveform of the high frequency wave will deteriorate.

On the other hand, when the transistor, which is suitable for the transition frequency optimal for the low amplitude output, is selected, the high amplitude output may exceed the limit of the collector current of the transistor.

Therefore, it is an object of the present invention to provide an amplitude varying driver circuit and a test apparatus which can solve the problem of the conventional technology described above. The above and other objects can be achieved by combinations described in the independent claims. The dependent claims define further advantageous and exemplary combinations of the present invention.

SUMMARY OF INVENTION

To solve the above-mentioned problem, according to a first aspect of the present invention, there is provided an amplitude varying driver circuit operable to output an output signal, which is an amplified input signal being supplied. The amplitude varying driver circuit includes: a plurality of differential amplifiers provided in parallel with one another, wherein a signal corresponding to the input signal is input into each base terminal thereof; a resistor section, which is provided in series with the plurality of differential amplifiers, operable to establish potential of the output signal according to total current flowing to the plurality of differential amplifiers; and an amplitude control transistor, which is provided in series with the plurality of differential amplifiers, operable to define total current flowing to the plurality of differential amplifiers.

The amplitude varying driver circuit may further include an amplitude control section operable to control the total current defined by the amplitude control transistor according to amplitude of the output signal to be output. Moreover, it may further include a drive control unit operable to control a current flowing to each of the differential amplifiers based on an amplitude of the output signal to be output, respectively.

The amplitude varying driver circuit may further include a plurality of individual current control transistors, which are provided corresponding to and the differential amplifiers, wherein the plurality of individual current control transistors are provided in series with the corresponding differential amplifiers, wherein the drive control unit may control current flowing to the differential amplifier corresponding to the individual current control transistor by controlling the voltage applied to a base terminal of each of the individual current control transistors.

The drive control unit may make the differential amplifiers of quantity according to amplitude of the output signal to be output operate. Moreover, the drive control unit may control current flowing to the operating differential amplifiers to be substantially the same as one another.

The amplitude varying driver circuit may further include a pre-driver circuit operable to control amplitude of a signal input into each base terminal of the plurality of differential amplifiers according to amplitude of the output signal to be output. Moreover, it may further include a potential fixed transistor, which is provided between the resistor section and the plurality of differential amplifier, operable to apply voltage to a base terminal thereof.

According to a second aspect of the present invention, there is provided a test apparatus operable to test an electronic device. The test apparatus includes: a pattern generating section operable to generate a test pattern for testing the electronic device; a waveform shaping section operable to generate an input signal to be input into the electronic device based on the test pattern; an amplitude varying driver circuit operable to input an output signal, which is the amplified input signal, into the electronic device; and a decision section operable to compare a signal output from the electronic device with a supplied expected value signal, and to decide acceptability of the electronic device, wherein the amplitude varying driver circuit includes: a plurality of differential amplifiers provided in parallel with one another, wherein a signal corresponding to the input signal is input into each base terminal thereof; a resistor section, which is provided in series with the plurality of differential amplifiers, operable to establish potential of the output signal according to total current flowing to the plurality of differential amplifiers; and an amplitude control transistor, which is provided in series with the plurality of differential amplifiers, operable to define total current flowing to the plurality of differential amplifiers.

The summary of the invention does not necessarily describe all necessary features of the present invention. The present invention may also be a sub-combination of the features described above.

BRIEF DESCRIPTION OF THE DRAWINGS

FIGS. 5A and 5B are drawings exemplary showing operation of the amplitude varying driver circuit 100 explained in FIG. 4, in which FIG. 5A is a drawing exemplary showing operation of a pre-driver circuit 118, and FIG. 5B is a drawing exemplary showing operation of each differential amplifier 106.

DETAILED DESCRIPTION OF THE INVENTION

The invention will now be described based on preferred embodiments, which do not intend to limit the scope of the present invention, but exemplify the invention. All of the features and the combinations thereof described in the embodiments are not necessarily essential to the invention.

Figure 1:
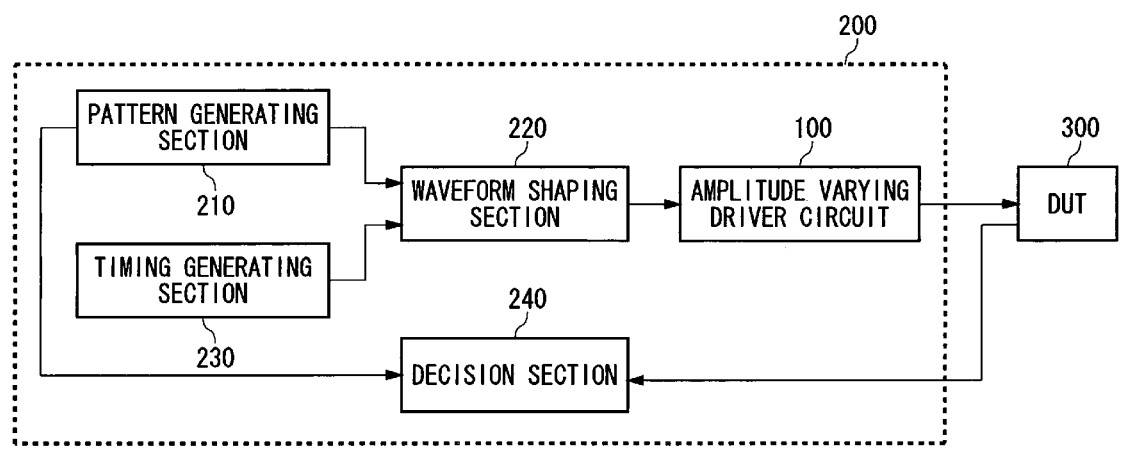
FIG. 1 is a drawing exemplary showing a configuration of a test apparatus 200 according to an embodiment of the present invention.

FIG. 1 is a drawing exemplary showing a configuration of a test apparatus 200 according to an embodiment of the present invention. The test apparatus 200 is an apparatus for testing an electronic devices 300, such as a semiconductor circuit, and includes a pattern generating section 210, a waveform shaping section 220, a timing generating section 230, an amplitude varying driver circuit 100, and a decision section 240. The pattern generating section 210 generates a test pattern for testing the electronic device 300. The test pattern is a digital signal which is expressed by 1/0 patterns.

The waveform shaping section 220 generates an input signal which is to be input into the electronic device 300 based on the test pattern. For example, the input signal having a voltage according to the test pattern is generated for each given timing.

The timing generating section 230 generates a timing clock having desired frequency, and supplies it to the waveform shaping section 220. The waveform shaping section 220 generates a voltage according to the test pattern according to a pulse of the timing clock.

The amplitude varying driver circuit 100 inputs an output signal according to the input signal to the electronic device 300. For example, the amplitude varying driver circuit 100 generates an output signal by changing the amplitude of the input signal according to the specification of the electronic device 300.

The decision section 240 compares the signal output from the electronic device 300 with the given expected value signal, and decides the acceptability of the electronic device 300. The pattern generating section 210 may generate an expected value signal based on the test pattern.

Figure 2:
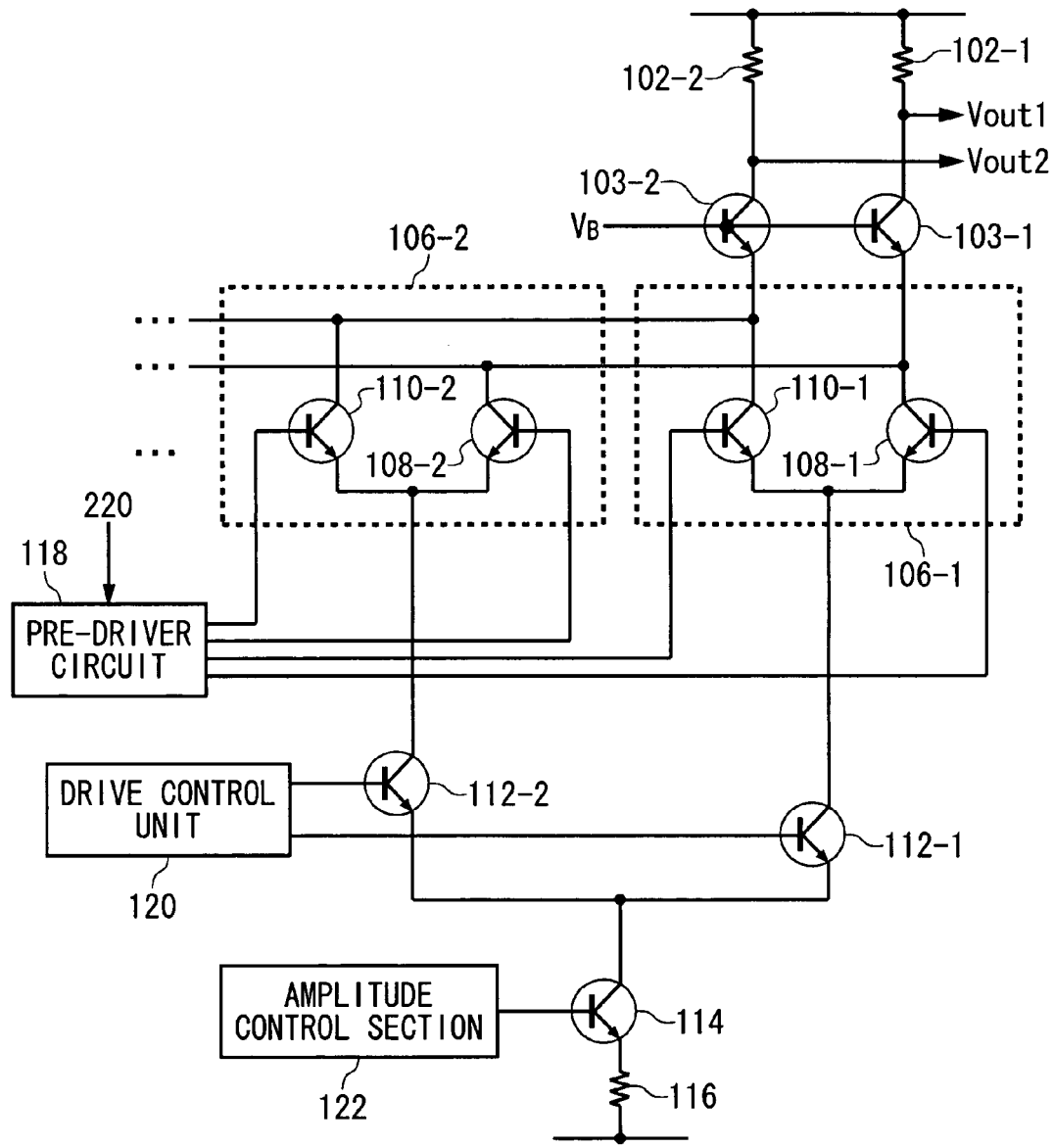
FIG. 2 is a drawing exemplary showing a configuration of an amplitude varying driver circuit 100.

FIG. 2 is a drawing exemplary showing a configuration of the amplitude varying driver circuit 100. The amplitude varying driver circuit 100 is a circuit which generates an output signal according to an input signal. The amplitude varying driver circuit 100 includes resistor sections (102-1~102-2, to be collectively referred to as 102 hereinafter), potential fixed transistors (103-1~103-2, to be collectively referred to as 103 hereinafter), a plurality of differential amplifier (106-1, 106-2, . . . , to be collectively referred to as 106 hereinafter) provided in parallel, a pre-driver circuit 118, a drive control unit 120, an amplitude control section 122, individual current control transistors (112-1~112-2, to be collectively referred to as 112 hereinafter), a amplitude control transistor 114, and a resistor 116.

Each of the differential amplifiers 106 includes transistors 108 and 110 provided in parallel, and a signal according to the input signal is input into a base terminal of each transistor.

The resistor sections 102 are provided in series with a plurality of differential amplifiers 106. That is, these are provided in series to the differential amplifiers 106, respectively. The resistor section 102-1 connects with the collector terminal of the transistor 108 of each of the differential amplifiers 106, and the resistor section 102-2 connects with the collector terminal of the transistor 110 of each differential amplifier 106. The resistor sections 102 generate potential of output signals (Vout1, Vout2) according to the total current flowing to the plurality of differential amplifiers 106.

The amplitude control transistor 114 and each of the plurality of differential amplifiers 106 are provided in series, and specifies the total current flowing to the plurality of differential amplifiers 106. That is, the amplitude of the output signal is settled according to the voltage applied to the base terminal of the amplitude control transistor 114. In this example, the amplitude control transistor 114 connects with an emitter terminal of each of the differential amplifiers 106, and the amplitude control transistor 114 is grounded via the resistor 116.

By such configuration, even if it is the case where a high amplitude output signal is to be output, required current can be distributed and the current flowing to one of the differential amplifiers 106 can be made low. Therefore, the waveform quality difference between the high amplitude signal and the low amplitude signal may be reduced.

Moreover, the amplitude control section 122 controls the total current defined by the amplitude control transistor 114 according to the amplitude of the output signal to be output. That is, the voltage applied to the base terminal of the amplitude control transistor 114 is changed according to the amplitude of the output signal. By such control, the output signal having desired amplitude is generated.

Moreover, the drive control unit 120 controls the current flowing to each differential amplifier 106 based on the amplitude of the output signal to be output, respectively. In this example, each of the individual current control transistors 112 is provided corresponding to each of the differential amplifiers, and is connected to the corresponding emitter terminal of the differential amplifier 106 in series. Then, the drive control unit 120 controls the current flowing to the differential amplifiers 106 corresponding to the individual current control transistors 112 by controlling the voltage applied to the base terminals of the individual current control transistors 112, respectively.

For example, the drive control unit 120 settles the quantity of the operating differential amplifiers 106 and controls each of the current control transistors 112 corresponding to the operating differential amplifiers 106 to ON state so that the current flowing to each of the differential amplifiers 106 becomes within a predetermined limit. The range of the current flowing to a differential amplifier 106 is predetermined within the range in which the differential amplifier 106 can operate properly.

By such control, the current flowing to each of the differential amplifiers 106 can be controlled within the predetermined proper range, and the differential amplifiers 106 can be used in the proper current range. Therefore, the variation of the waveform quality between the high amplitude output and the low amplitude output can be reduced, and an output signal, of which the amplitude varies a lot, can be generated with sufficient accuracy.

Moreover, the pre-driver circuit 118 controls the amplitude of the signals input into base terminals of the plurality of differential amplifiers 106 according to the amplitude of the output signal to be output. The pre-driver circuit 118 receives the input signals, changes the amplitudes of the input signals according to the amplitudes of the output signals to be output, and inputs them to the base terminals of the differential amplifiers 106, respectively. For example, for the current flowing to each of the differential amplifier 106, the pre-driver circuit 118 changes the amplitudes of the input signals, respectively, and inputs them so that the differential amplifiers 106 may operate properly. In this example, the pre-driver circuit 118 generates signals which are to be supplied to the base terminals of the differential amplifiers 106.

Moreover, the potential fixed transistors 103 are provided between the resistor sections 102 and the plurality of differential amplifiers 106, and fixed voltage is applied to each base terminal. Thereby, the potential of the collector terminal of each of the differential amplifiers 106 can be maintained at substantially constant, and charge/discharge to/from the capacitance component by switching operation of the differential amplifiers 106 can be prevented. Therefore, the differential amplifiers 106 can be operated speedy with sufficient accuracy.

In this example, when the current flowing to the amplitude control transistor 114 is within the predetermined proper current limit for a differential amplifier 106, the drive control unit 120 makes only one differential amplifier 106 (the differential amplifier 106-1 in this example) to be operated. That is, the individual current control transistor 112-1 is controlled to be in ON state, and other individual current control transistors 112 are controlled to be in OFF state.

Figure 3:
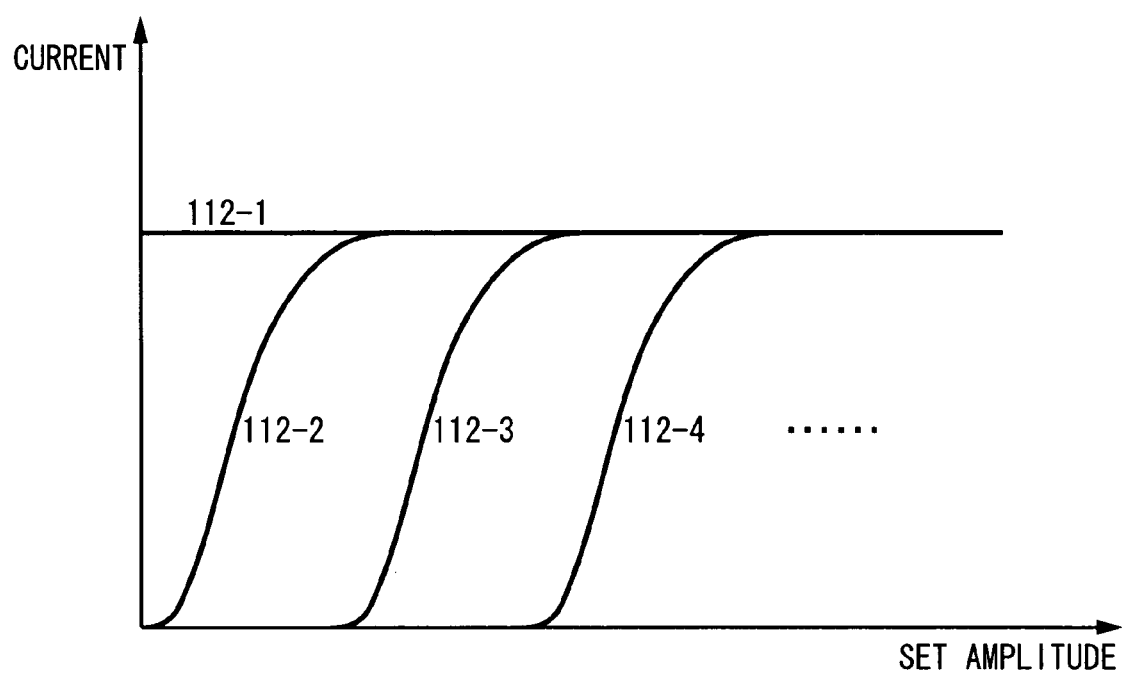
FIG. 3 is a drawing exemplary showing operation of the amplitude varying driver circuit 100 explained in FIG. 2.

FIG. 3 is a drawing exemplary showing operation of the amplitude varying driver circuit 100 explained with reference to FIG. 2. In FIG. 3, an axis of abscissa shows set values of the amplitude of the output signals, and an axis of ordinate shows the current flowing to each individual current control transistor 112.

When the total current of the drive control unit 120 flowing to the amplitude control transistor 114 is greater than larger than the proper current range of a differential amplifier 106, the total current is divided by the upper limit of the proper current range, the differential amplifiers 106 of the quantity of the quotient of the division are made to operate at the upper limit of the proper current range (straight line of the current waveform in FIG. 3), and the current, of which the value is equal to the remainder of the differential, flows to another differential amplifier 106 (curved section of the current waveform in FIG. 3). That is, each of the individual current control transistors 112 are controlled so that tail current may flow to a pair of each of the differential amplifiers 106 in order as the set amplitude of the output signal increases.

At this time, the pre-driver circuit 118 supplies signals according to the input signals to the base terminals of the operating differential amplifiers 106.

By such control, when the total current flowing to the amplitude control transistor 114 is high, current can be dispersedly flows to the plurality of differential amplifiers 106. Therefore, each of the differential amplifiers 106 can be made to operate in the proper current range.

Figure 4:
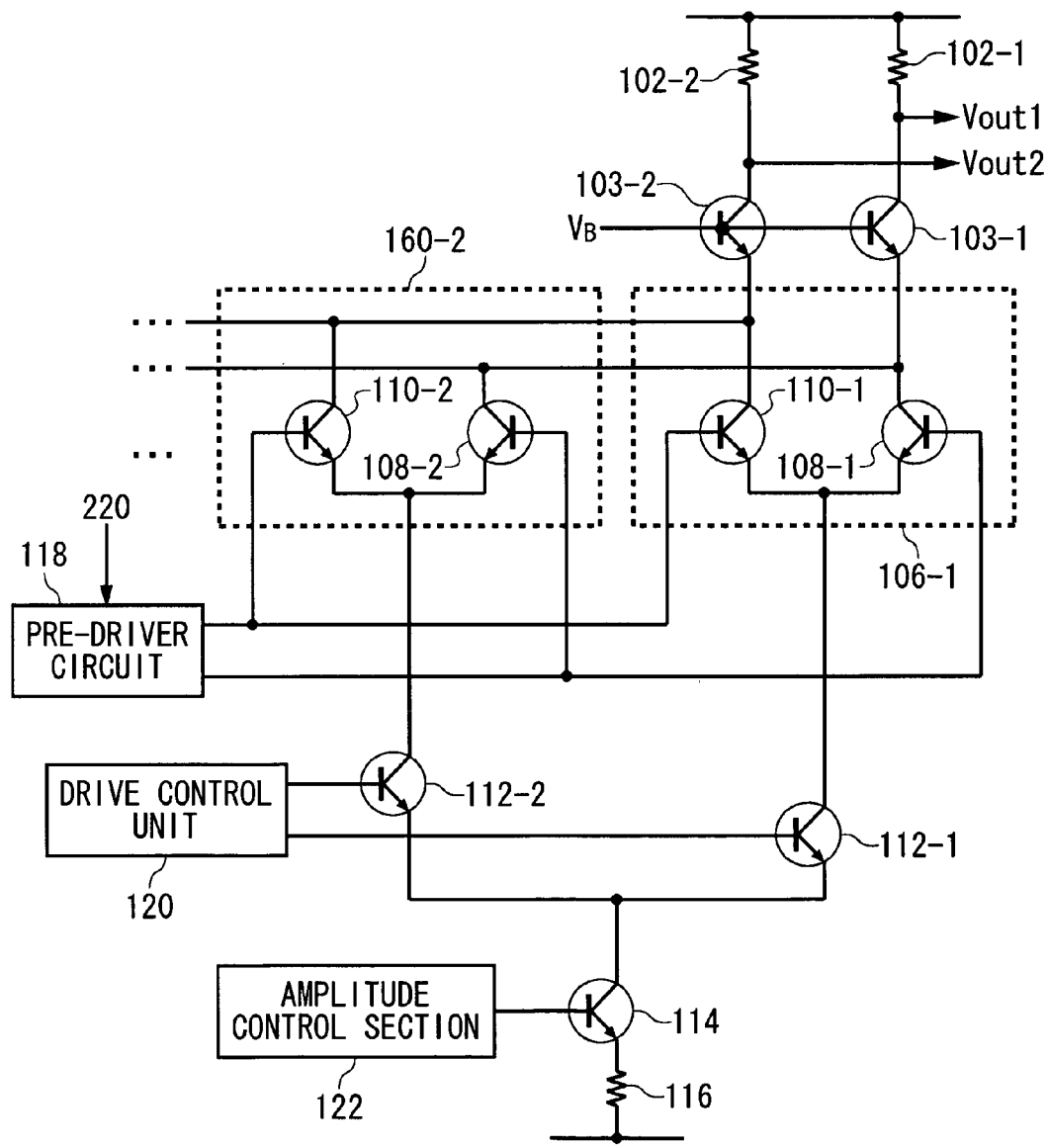
FIG. 4 is a drawing showing another example of a configuration of the amplitude varying driver circuit 100.

FIG. 4 is a drawing showing another example of a configuration of the amplitude varying driver circuit 100. The amplitude varying driver circuit 100 in this example includes the same configuration as the amplitude varying driver circuit 100 explained with reference to FIG. 2 except for the pre-driver circuit 118.

Although the pre-driver circuit 118 in FIG. 2 generates signals to the base terminals of the differential amplifiers 106, respectively, the pre-driver circuit 118 in this example generates a common signal to the differential amplifiers 106 and supplies it. Like the case explained with reference to FIG. 2, the pre-driver circuit 118 changes the amplitudes of the input signals, respectively, and inputs them so that each of the differential amplifiers 106 may operate properly. For example, the amplitudes of the input signals are made to vary in proportion to the set amplitudes of the output signals.

Moreover, according to this example, the drive control unit 120 controls the individual current control transistors 112 so that tail current may flow to a pair of each of the differential amplifiers 106 in order as the set amplitude of the output signal increases as is explained in FIG. 3. Thereby, each of the differential amplifiers 106 can be made to operate in the proper current range by simple control.

Moreover, according to the configuration shown in FIG. 4, the drive control unit 120 may control each of the individual current control transistors 112 so that the current flowing to the operating differential amplifiers 106 may be substantially the same as one another. Next, operation of the amplitude varying driver circuit 100 in the case of substantially the same current flows to each of the differential amplifiers 106 will be explained.

FIGS. 5A and 5B are drawings exemplary showing operation of the amplitude varying driver circuit 100 explained with reference to FIG. 4. FIG. 5A is a drawing exemplary showing operation of the pre-driver circuit 118, and FIG. 5B is a drawing exemplary showing operation of the individual current control transistors 112. Moreover, in FIG. 5A, an axis of abscissa indicates set-up values of the amplitude of the output signals, and an axis of ordinate indicates set-up values of the amplitudes of the signals output from the pre-driver circuit 118. Moreover, in FIG. 5B, an axis of abscissa indicates set-up values of the amplitudes of the output signals, and an axis of ordinate indicates the current flowing to the individual current control transistors 112.

The drive control unit 120 makes only one differential amplifier 106 operate when the current flowing to the amplitude control transistor 114 is within the predetermined proper current for a differential amplifier 106 (the differential amplifier 106-1 in this example). That is, the individual current control transistor 112-1 is controlled to be in ON state, and other individual current control transistors 112 are controlled to be in an OFF state.

Then, the pre-driver circuit 118 amplifies the input signal according to the set amplitude of the output signal and supplies it to the base terminal of each of the differential amplifiers 106. At this time, the current flowing to the differential amplifier 106-1 is equal to the current I which flows to the amplitude control transistor 114.

Moreover, when the total current flowing to the amplitude control transistor 114 is greater than the proper current range of a differential amplifier 106, the drive control unit 120 divides the total current by the upper limit of the proper current range, and the differential amplifiers 106 of the quantity of the raised quotient of the division are made to operate. That is, the individual current control transistors 112 corresponding to the differential amplifiers 106 are controlled in the ON state. Then, it is controlled so that the current flowing to the operating differential amplifiers 106 becomes substantially the same as one another. Since the range of fluctuation of current flowing to each of the differential amplifier 106 becomes small according to such control, the output signal having large varying amplitude range is generable with sufficient accuracy.

Moreover, as shown in FIG. 5A, when the quantity of the operating differential amplifier 106 changes, the pre-driver circuit controls the amplitudes of the signals supplied to the base terminals of the operating differential amplifiers 106 so that the continuity of the total current flowing to the operating differential amplifiers 106 may be maintained.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

As is apparent from the above-mentioned explanation, according to the present invention, variation in waveform quality between a high amplitude output and a low amplitude output can be reduced, and an output signal having wide varying amplitude range can be generated with sufficient accuracy.

What is claimed is:

1. An amplitude varying driver circuit operable to output an output signal, which is an amplified input signal being directly supplied to said driver circuit, comprising:
    a plurality of differential amplifiers provided in parallel with one another, wherein a signal corresponding to the input signal is input into each base terminal thereof;
    a pre-driver circuit connected with each base terminal of said plurality of differential amplifiers, receiving said input signal and providing the signal corresponding to said input signal to each base terminal of said plurality of differential amplifiers;
    a resistor section, which is provided in series with said plurality of differential amplifiers, operable to establish potential of the output signal according to a total current flowing to said plurality of differential amplifiers; and
    an amplitude control transistor, which is provided in series with said plurality of differential amplifiers, operable to define the total current flowing to said plurality of differential amplifiers by varying a current flowing to said amplitude control transistor.

2. The amplitude varying driver circuit as claimed in claim 1, further comprising an amplitude control section operable to control the total current defined by said amplitude control transistor according to an amplitude of the output signal to be output.

3. The amplitude varying driver circuit as claimed in claim 2, further comprising a drive control unit operable to control a current flowing to each of said differential amplifiers based on an amplitude of the output signal to be output, respectively.

4. The amplitude varying driver circuit given in claim 3, further comprising a plurality of individual current control transistors, which are provided corresponding to said differential amplifiers, wherein said plurality of individual current control transistors are provided in series with said corresponding differential amplifiers, wherein
    said drive control unit controls current flowing to said differential amplifier corresponding to said individual current control transistor by controlling the voltage applied to a base terminal of each of said individual current control transistors.

5. The amplitude varying driver circuit as claimed in claim 4, wherein said drive control unit changes the number of said plurality of differential amplifiers that are operated according to amplitude of the output signal to be output.

6. The amplitude varying driver circuit as claimed in claim 5, wherein said drive control unit controls current flowing to said operating differential amplifiers to be substantially the same as one another.

7. The amplitude varying driver circuit as claimed in claim 3, further comprising a potential fixed transistor, which is provided between the resistor section and said plurality of differential amplifier, operable to apply voltage to a base terminal thereof.

8. The amplitude varying driver circuit as claimed in claim 1, wherein said pre-driver circuit controls the amplitude of said input signal into each base terminal of said plurality of differential amplifiers according to amplitude of the output signal to be output.

9. An amplitude varying driver circuit as claimed in claim 1, wherein said input signal is directly supplied from a waveform shaping section of a test apparatus for testing an electronic device.

* * * * *